United States Patent
Khanna et al.

(10) Patent No.: US 9,630,269 B2
(45) Date of Patent: Apr. 25, 2017

(54) MECHANISM TO ATTACH A DIE TO A SUBSTRATE

(71) Applicant: INTERNATIONAL BUSINESS MACHINES CORPORATION, Armonk, NY (US)

(72) Inventors: Vijayeshwar D. Khanna, Millwood, NY (US); Mohammed S. Shaikh, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 75 days.

(21) Appl. No.: 14/066,989

(22) Filed: Oct. 30, 2013

(65) Prior Publication Data

US 2015/0118799 A1    Apr. 30, 2015

(51) Int. Cl.
| | |
|---|---|
| *H01L 23/48* | (2006.01) |
| *B23K 3/08* | (2006.01) |
| *H01L 23/00* | (2006.01) |
| *B23K 1/00* | (2006.01) |

(Continued)

(52) U.S. Cl.
CPC ............. *B23K 3/087* (2013.01); *B23K 1/008* (2013.01); *B23K 1/0016* (2013.01); *H01L 24/75* (2013.01); *B23K 2201/40* (2013.01); *H01L 24/81* (2013.01); *H01L 2224/13147* (2013.01); *H01L 2224/75252* (2013.01); *H01L 2224/75315* (2013.01); *H01L 2224/75318* (2013.01); *H01L 2224/75705* (2013.01); *H01L 2224/75745* (2013.01); *H01L 2224/81191* (2013.01); *H01L 2224/81203* (2013.01); *H01L 2224/81815* (2013.01); *H01L 2924/15787* (2013.01)

(58) Field of Classification Search
CPC ................................ H01L 24/75; B23K 3/087
USPC .......................................................... 257/782
See application file for complete search history.

(56) References Cited

U.S. PATENT DOCUMENTS

| | | | |
|---|---|---|---|
| 5,273,553 A | 12/1993 | Hoshi et al. | |
| 5,281,794 A | 1/1994 | Uehara et al. | |
| 5,348,316 A * | 9/1994 | Lin | ................................. 279/3 |

(Continued)

FOREIGN PATENT DOCUMENTS

| | | |
|---|---|---|
| JP | 2001127421 A | 5/2001 |
| JP | 2002231745 A | 8/2002 |
| JP | 2006165188 A | 6/2006 |

OTHER PUBLICATIONS

Dawson, M. et al., "Gasket Assembly for Vacuum Chuck", IPCOM000040945D, Apr. 1, 1987, 2 pages.

(Continued)

*Primary Examiner* — Ajay K Arora
(74) *Attorney, Agent, or Firm* — David Cain; Andrew M. Calderon; Roberts Mlotkowski Safran Cole & Calderon, P.C.

(57) ABSTRACT

A mechanism to attach a die to a substrate and method of use are disclosed. The vacuum carrier includes a frame composed of material compatible with solder reflow process. The vacuum carrier further includes a vacuum port extending from a top surface to an underside surface of the frame. The vacuum carrier further includes a seal mechanism provided about a perimeter on the underside surface of the frame of the vacuum carrier. The frame and seal mechanism are structured to maintain a flatness of a die attached to the vacuum carrier by a vacuum source during the solder reflow process.

20 Claims, 3 Drawing Sheets

(51) Int. Cl.
*B23K 1/008* (2006.01)
*B23K 101/40* (2006.01)

(56) References Cited

U.S. PATENT DOCUMENTS

| | | | |
|---|---|---|---|
| 5,441,195 A * | 8/1995 | Tustaniwskyj | B23K 1/0008 228/180.22 |
| 5,707,051 A | 1/1998 | Tsuji | |
| 6,279,976 B1 * | 8/2001 | Ball | 279/3 |
| 6,435,492 B1 | 8/2002 | Behler et al. | |
| 6,650,011 B2 | 11/2003 | Partosa et al. | |
| 7,028,397 B2 | 4/2006 | Abe et al. | |
| 2001/0039167 A1 * | 11/2001 | Saguchi | B24B 37/30 451/41 |
| 2003/0037821 A1 * | 2/2003 | Ji | 137/517 |
| 2007/0181644 A1 | 8/2007 | Ueno et al. | |
| 2009/0033111 A1 * | 2/2009 | Hupp | 294/64.1 |
| 2013/0260534 A1 * | 10/2013 | Khanna et al. | 438/457 |

OTHER PUBLICATIONS

Specification for U.S. Appl. No. 13/959,867, filed Aug. 6, 2013, not yet published, 23 pages.

* cited by examiner

MECHANISM TO ATTACH A DIE TO A SUBSTRATE

FIELD OF THE INVENTION

The invention relates to the manufacture of semiconductor structures and, more particularly, to a mechanism to attach a die to a substrate and method of use.

BACKGROUND

Dies have a tendency to warp or bow during solder reflow processes. This is due to coefficient of thermal expansion (CTE) mismatch between different materials of the die. Due to this warpage, it becomes very difficult to attach the die to a planar substrate in order to achieve a reliable joint. In one example, the die can be a semiconductor chip which requires a very flat surface in order for the solder connections, e.g., C4 connections, to properly connect to a package assembly (planar substrate). In another example, the die can have probe tips assembled on its top surface that are to be used to probe a silicon wafer for electrical tests. These die require they be attached to a rigid ceramic substrate with a very flat probing surface to achieve uniform and reliable contacts with the wafer.

More specifically, a die is made from a silicon wafer which has multiple metallic and/or organic buildup layers on its top surface that act as electrical redistribution layers. The silicon die could also have through-silicon-vias (TSVs) that connect electrical circuitry on these buildup layers to copper interconnects, pillars, etc. The buildup layers, generally, have a much higher thermal expansion than their supporting silicon die. This mismatch causes the composite structure of the die to warp with a rise in temperature. Accordingly the die is no longer flat at the elevated temperatures during reflow.

In the joining process of a typical die to a substrate, the die warp results in non-uniform and unreliable contacts for the thousands of connections between the die and the substrate. In the extreme, the warpage results in non-existent connections (non-wets) between the C4s or copper pillars and their corresponding pads on the substrate, leaving an electrical open circuit. In the example of the probe die which is typically attached to a rigid ceramic substrate, the die warpage gets locked in when the solder solidifies during cool down and makes it difficult to achieve the very tight flatness tolerance needed for the probing process.

SUMMARY

In an aspect of the invention, a vacuum carrier comprises a frame composed of material compatible with solder reflow process. The vacuum carrier further comprises a vacuum port extending from a top surface to an underside surface of the frame. The vacuum carrier further comprises a seal mechanism provided about a perimeter on the underside surface of the frame of the vacuum carrier. The frame and seal mechanism are structured to maintain a flatness of a die attached to the vacuum carrier by a vacuum source during the solder reflow process.

In an aspect of the invention, a vacuum carrier comprises a frame composed of material compatible with solder reflow process. The vacuum carrier further comprises a vacuum chamber within the frame, and a seal mechanism provided about an entire perimeter of the frame of the vacuum carrier.

In an aspect of the invention, a method comprises: seating a die on a seal of a vacuum carrier; applying a vacuum source to maintain the die on the seal and in a planar state during a solder reflow process; aligning connections of the die to connections of a substrate; performing the solder reflow processes to connect the die to the substrate, while maintaining the die in the planar state; and removing the die from the vacuum chamber after the solder reflow processes.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to the manufacture of semiconductor structures and, more particularly, to a mechanism to attach a warped die to a substrate and method of use. More specifically, the present invention is directed to a vacuum carrier that is capable of maintaining the flatness of the die so that the die can be reflowed onto a substrate using a thermal compression bonder or solder reflow oven. In embodiments, the vacuum carrier can have a self-contained vacuum chamber for use with a solder reflow oven.

In embodiments, the vacuum carrier is designed to maintain a planar surface of a semiconductor die being attached to a substrate with a solder reflow process. The vacuum carrier includes a housing having an interior annular space extending from a top surface to a bottom surface. The annular space can also expand laterally at the bottom of the housing. A vacuum gasket is coupled to and extending around a perimeter of the vacuum carrier, such that the vacuum gasket contacts perimeter edges of the semiconductor die. The vacuum carrier can flatten out a warped die for reflowing the die onto a substrate using a thermal compression bonder or a reflow oven.

Advantageously, the present invention is small and lightweight, thus having minimal impact on the thermal compression bonder and solder reflow oven. That is, the vacuum carrier is completely transparent to the thermal compression bonder and solder reflow oven. In this way, the thermal compression bonder and solder reflow oven do not need to be redesigned in order to accommodate the vacuum carrier. This minimizes the monetary impact of implementing the present invention. Also, in the implementation of the solder reflow oven, the vacuum carrier and substrate assembly still has the ability to float and self-align on the molten solder by the surface tension of the molten solder.

The use of the vacuum carrier has the additional advantage of simplicity of attachment and removal and does not contaminate the surface of the die as is seen by adhesive attachment methods. Moreover, the vacuum carrier provides advantages over mechanical clamping methods. For example, mechanical clamping methods are not compatible with holding a die flat since there is no extra surface on the die to apply clamps.

Figure 1A:
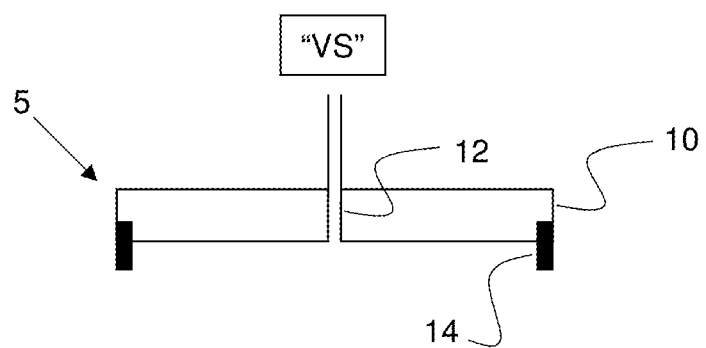
FIG. 1a shows a cross-sectional view of a vacuum carrier in accordance with aspects of the present invention.
Figure 1B:
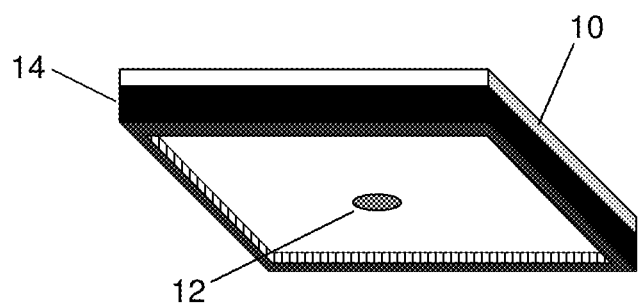
FIG. 1b shows a perspective view of the vacuum carrier of FIG. 1a, in accordance with aspects of the present invention.

FIG. 1a shows a cross-sectional view of a vacuum carrier in accordance with aspects of the present invention. FIG. 1b shows a perspective view of the vacuum carrier of FIG. 1a. As shown in FIGS. 1a and 1b, a vacuum carrier 5 includes a housing or frame 10 having a vacuum channel or port 12 extending through the frame 10 (from a front surface to a rear surface). The vacuum channel or port 12 can be an annular opening extending from a top surface to an underside surface of the frame. The vacuum channel or port 12 is connected to a vacuum source "VS". In embodiments, the frame 10 can be composed of any rigid material that is compatible with solder reflow processes. For example, the frame 10 can be steel, aluminum, glass or other materials that are capable of withstanding the temperatures required for solder reflow processes. In embodiments, the frame 10 can be sized and shaped to accommodate any die (chip), and can include a flat surface to maintain the planarity of a die during solder reflow processes. This is due to the forces applied to the surface of the die when under vacuum.

Still referring to FIGS. 1a and 1b, a seal mechanism (e.g., gasket) 14 is provided about a perimeter or edge of the frame 10, in order to provide a vacuum seal for picking up a die, e.g., to minimize any vacuum loss, and allowing it to maintain its flatness. In any of the embodiments, the seal mechanism 14 may be provided about an entire perimeter of the frame, extending downward from an underside thereof. The seal mechanism 14 is structured and designed to provide a vacuum seal and maintain a planarity of the die when under vacuum conditions and during reflow processes.

The seal mechanism 14 can be any elastomeric material such as silicone rubber, synthetic rubber and fluoropolymer elastomers (e.g., Viton®, which is a registered trademark of DuPont Performance Elastomers L.L.C.), elastomeric o-rings (e.g., Kalrez®, which is a registered trademark of E. I. Du Pont de Nemours and Company) or a flexible high temperature epoxy. In embodiments, the flexible high temperature epoxy should be compatible with organic strippers, as an example. In further embodiments, in case of a rigid seal mechanism 14, the frame 10 and the seal mechanism 14 should have a similar CTE. In this way, the seal mechanism 14 will react to the temperature fluctuations in the same manner as the frame 10.

Figure 2A:
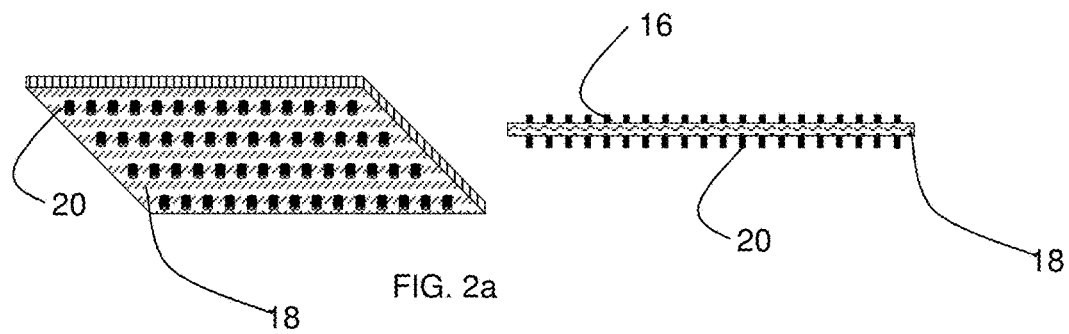
FIG. 2a shows a perspective bottom view of a probe chip and a cross-sectional view of the chip, in accordance with aspects of the present invention.

FIG. 2a shows a bottom perspective and a cross-section view of a die or chip 18 to be attached to a substrate by a solder reflow process. In embodiments, the die or chip 18 is shown with probe tips 16 on its upper surface and copper pillars or C4s 20 on its lower surface. These copper pillars or C4s 20 will be reflowed to attach the lower surface of the die or chip 18 to a substrate 24 (see, e.g., FIG. 3).

Figure 2B:
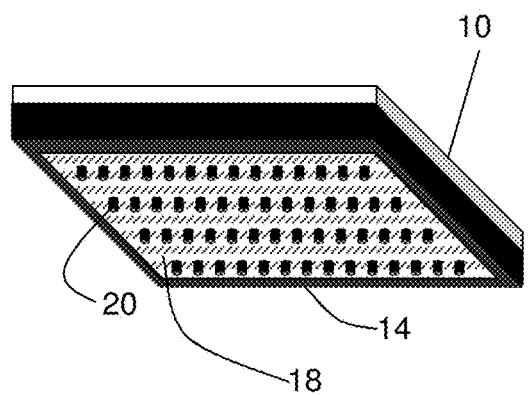
FIG. 2b shows a die or chip attached to the vacuum carrier in accordance with aspects of the present invention.

FIG. 2b shows the die or chip 18 attached to the vacuum carrier in accordance with aspects of the present invention. More specifically, a die 18 is held to the frame 10 of the vacuum carrier by a vacuum source "VS" through the frame 10, e.g., through the vacuum channel or port 12. In embodiments, the seal mechanism 14 seals the die 18 to the frame 10, with the use of the vacuum source "VS". The vacuum that feeds into a space between the vacuum carrier and die 18 pulls the die 18 against the surface of the vacuum carrier and also pulls the surface of the seal 14 against the edge of the die with about one atmospheric pressure (14.7 psi). This pressure has been found to be sufficient to hold the die 18 rigidly against the flat surface of the vacuum carrier. In embodiments, the die 18 can include copper pillars or other interconnects 20.

Figure 3:
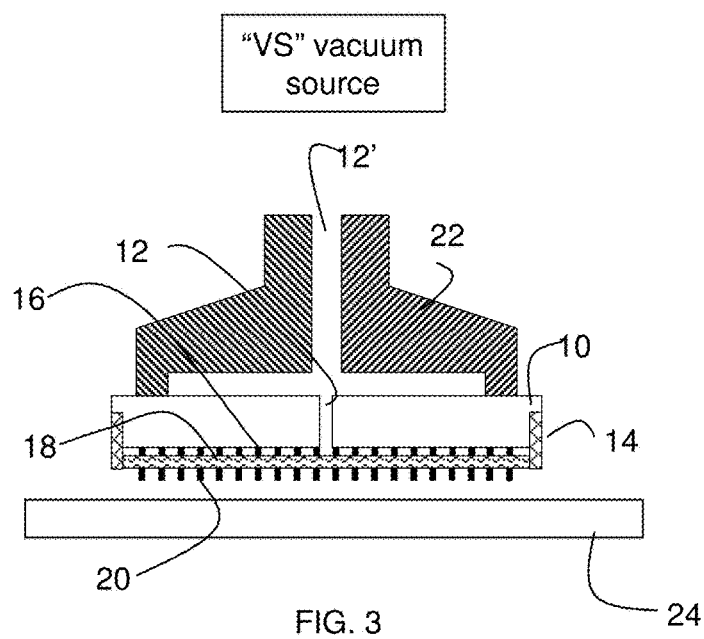
FIG. 3 shows the vacuum carrier attached to a tool in accordance with aspects of the present invention.

FIG. 3 shows the vacuum carrier attached to a tool in accordance with aspects of the present invention. More specifically, in the embodiment of FIG. 3, the vacuum carrier is attached to a thermal compression bonder 22, e.g., by a vacuum source or other mechanical mechanism. The thermal compression bonder 22 includes a vacuum port 12' in vacuum communication with the vacuum port 12 of the vacuum carrier. By applying a vacuum source, the thermal compression bonder 22 can pick up the die 18 held by the vacuum carrier. The thermal compression bonder 22 can then perform a sequence of aligning the die 18 with the substrate 24 and lowering the die 18 into place while heating the solder to achieve reflow. Once the solder is solidified, the thermal compression bonder 22 releases the assembly, i.e., vacuum carrier, die 18 and substrate 24. The die 18 and substrate 24 are then gently removed from the vacuum carrier 5. In embodiments, the die 18 and substrate 24 can be removed by discontinuing the vacuum source. Alternatively, when the seal mechanism 14 is an epoxy, the die 18 and substrate 24 can be removed from the vacuum carrier by an organic stripper.

Figure 4A:
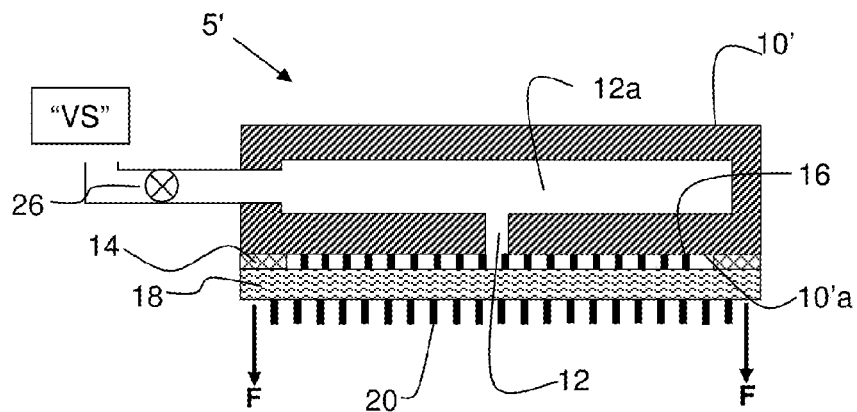
FIG. 4a shows a cross-sectional view of a vacuum carrier in accordance with additional aspects of the present invention.
Figure 4B:
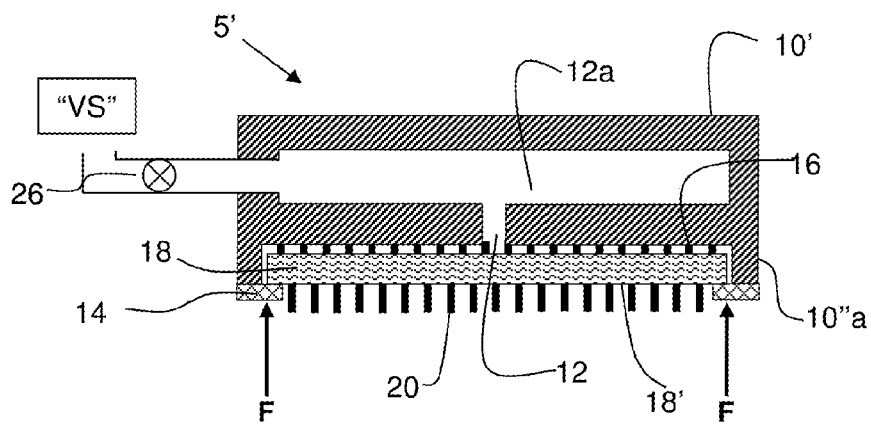
FIG. 4b shows a cross-sectional view of a vacuum carrier in accordance with additional aspects of the present invention.
Figure 4C:
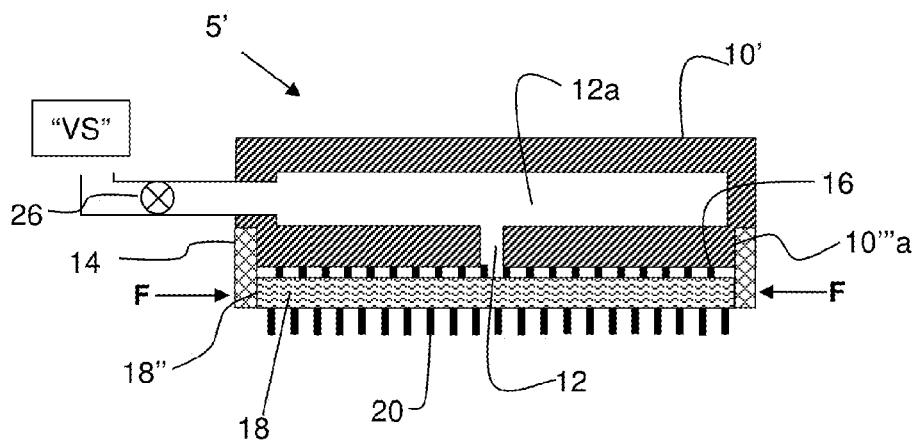
FIG. 4c shows a cross-sectional view of a vacuum carrier in accordance with additional aspects of the present invention.

FIGS. 4a-4c show cross-sectional views of various vacuum carriers in accordance with additional aspects of the present invention. The vacuum carriers 5' are each designed for use with a reflow oven. In these embodiments, each vacuum carrier 5' comprises a frame 10' with a self-contained vacuum chamber 12a in vacuum communication with the vacuum port 12. In embodiments, the self-contained vacuum chamber 12a is perpendicular to the vacuum port 12, and is preferably positioned about a longitudinal axis of the frame 10'. The vacuum chamber 12a is connected to a vacuum source "VS" through an external port with a check valve 26. In embodiments, the self-contained vacuum chamber 12a replenishes any vacuum leaks while within the reflow oven. The check valve 26 closes the self-contained vacuum chamber 12a in order to maintain the vacuum during the reflow processes. After reflowing processes within the reflow oven, e.g., after the solder solidifies, the die 18 and substrate 24 are gently removed from the vacuum carrier 5' as already described herein.

As in any of the aspects of the present invention, the sealing mechanism 14 is provided about a perimeter or edge of the frame 10'. As in any of the aspects of the invention, the seal mechanism 14 can be any elastomeric material such as silicone rubber, synthetic rubber and fluoropolymer elastomers (e.g., Viton®, which is a registered trademark of DuPont Performance Elastomers L.L.C.), elastomeric o-rings (e.g., Kalrez®, which is a registered trademark of E. I. Du Pont de Nemours and Company) or a flexible high temperature epoxy as described herein. Also, the frame 10' can be steel, aluminum, glass or other materials that are capable of withstanding the temperatures required for solder reflow processes.

In FIG. 4a, the sealing mechanism 14 is provided about a perimeter or edge of the frame 10' and more particularly between a lower surface 10'a of the frame 10' and an upper surface of the die 18. In this embodiment, the sealing forces applied on the die 18 would be downward forces as is shown by the arrows labeled 'F'.

In FIG. 4*b*, the seal mechanism 14 is provided about a perimeter or edge of the frame 10' and more particularly is attached to a lower extending portion 10"*a* of the frame 10'. In this embodiment, the seal mechanism 14 is provided on the outer lower surface of the die 18, such that the sealing forces push the die 18 against the carrier surface as shown by the arrows labeled 'F'. The downward extending member 10"*a* is provided about an entire perimeter of the frame 10'. In embodiments, the lower surface 18' of the die 18 includes the C4s or copper pillars 20 that are to join with the substrate. Accordingly, the thickness of the seal mechanism 14 should be thinner than the height of the C4s/pillars 20. In embodiments, the die 18 can include recessed portions to accommodate a thicker seal mechanism 14.

In FIG. 4*c*, the seal mechanism 14 is provided about a perimeter or edge of the frame 10' and more particularly is provided on an outer rim surface 10'''*a* of the frame 10'. In embodiments, the outer rim surface 10'''*a* comprises a stepped portion such that the seal mechanism 14 can be seated therein. In this embodiment, the seal mechanism 14 is seated on an outer diced surface 18" of the die 18, which is preferably a smooth surface. In this embodiment, forces 'F' applied on the die 18 would be horizontally against the outer diced surface 18".

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A vacuum carrier, comprising:
   a frame having a first material compatible with a solder reflow process;
   a vacuum port extending from a top surface to an underside surface of the frame; and
   a seal mechanism comprising a second material different than the first material, attached to an edge on a lowermost surface of the frame of the vacuum carrier,
   wherein the frame and seal mechanism are structured to maintain a flatness of a die attached to the vacuum carrier by a vacuum source during the solder reflow process.

2. The vacuum carrier of claim 1, wherein the frame includes a surface which maintains the flatness of the die during the solder reflow process.

3. The vacuum carrier of claim 1, wherein the seal mechanism comprises an epoxy.

4. The vacuum carrier of claim 1, wherein the seal mechanism comprises an elastomeric material.

5. The vacuum carrier of claim 1, further comprising:
   a vacuum chamber in vacuum communication with the vacuum port; and
   a check valve for preventing leakage of vacuum from the vacuum chamber,
   wherein the vacuum chamber is self-contained within the frame between the vacuum port and the check valve.

6. The vacuum carrier of claim 1, wherein:
   the frame includes a downward extending member extending downward from the underside surface of the frame;
   the lowermost surface is on the downward extending member;
   an upper surface of the seal mechanism is seated on the lowermost surface on the downward extending member; and
   the upper surface of the seal mechanism is positioned to contact a lower surface of the die which includes die connections.

7. The vacuum carrier of claim 6, wherein sealing forces push the die against the bottom surface of the frame.

8. The vacuum carrier of claim 7, wherein a thickness of the seal mechanism is smaller than a height of the connections, such that the connections extend downward farther than a lower surface of the seal mechanism.

9. A vacuum carrier, comprising:
   a frame composed of a first material compatible with solder reflow process;
   a vacuum chamber within the frame;
   a seal mechanism comprising a second material different than the first material and provided about an entire edge of the frame of the vacuum, wherein
   the seal mechanism is on an outer rim surface of the frame, and
   the outer rim surface comprises a stepped portion such that the seal mechanism can be seated therein.

10. The vacuum carrier of claim 9, wherein the seal mechanism is an epoxy.

11. The vacuum carrier of claim 9, wherein the seal mechanism is an elastomeric material.

12. The vacuum carrier of claim 9, wherein the vacuum chamber has a vacuum port.

13. The vacuum carrier of claim 9, wherein the vacuum chamber is an annular chamber within the frame, which is in vacuum communication with the vacuum port.

14. The vacuum carrier of claim 13, further comprising a check valve for preventing leakage of vacuum from the vacuum chamber.

15. The vacuum carrier of claim 9, wherein:
   the stepped portion defines an outer edge surface of the frame;
   the outer edge surface of the frame is perpendicular to a horizontal underside surface of the frame;
   an inner surface of the seal mechanism is seated within the stepped portion and contacts the outer edge surface of the frame; and the inner surface of the seal mechanism is positioned to contact an outer edge surface of the die.

16. The vacuum carrier of claim 9, wherein the frame includes a surface which maintains a flatness of the die during the solder reflow process.

17. The vacuum carrier of claim 1, wherein the seal mechanism comprises a rigid material with a similar coefficient of thermal expansion as the frame and the seal mechanism is structured to contact an outer edge of the die including the four upper corners of the die.

18. The vacuum carrier of claim 9, wherein the seal mechanism comprises a rigid material with a similar coefficient of thermal expansion as the frame and the seal mechanism is structured to contact an outer edge of the die including the four upper corners of the die.

19. The vacuum carrier of claim 1, wherein the lowermost surface is the underside surface of the frame.

20. A vacuum carrier, comprising:
a frame composed of a first material compatible with solder reflow process;
a vacuum port extending from a top surface to an underside surface of the frame;
a seal mechanism comprising a second material different than the first material; and
a thermal compression bonder attached to the frame;
wherein the frame includes a stepped portion that defines an outer edge surface of the frame that is perpendicular to a horizontal underside surface of the frame; and
the seal mechanism is seated in the stepped portion such that: an inner surface of the seal mechanism contacts the outer edge surface of the frame, and the inner surface of the seal mechanism is positioned to contact an outer edge surface of a die held by the frame.

* * * * *